United States Patent
Yun et al.

(10) Patent No.: US 8,625,367 B2
(45) Date of Patent: Jan. 7, 2014

(54) MEMORY DEVICES AND PROGRAM METHODS THEREOF

(75) Inventors: Sung-Won Yun, Sunwon-si (KR); ChiWeon Yoon, Seoul (KR); Kyung-Hwa Kang, Seoul (KR); JinTae Kim, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 23 days.

(21) Appl. No.: 13/476,196

(22) Filed: May 21, 2012

(65) Prior Publication Data

US 2012/0300561 A1 Nov. 29, 2012

(30) Foreign Application Priority Data

May 23, 2011 (KR) ........................ 10-2011-0048638

(51) Int. Cl.
*G11C 5/14* (2006.01)
*G11C 16/00* (2006.01)

(52) U.S. Cl.
USPC ............ 365/189.09; 365/185.18; 365/185.19; 365/185.23; 365/185.28

(58) Field of Classification Search
USPC ........................................................ 365/130
See application file for complete search history.

(56) References Cited

U.S. PATENT DOCUMENTS

| | | | |
|---|---|---|---|
| 6,396,738 B1 | 5/2002 | Tamada et al. | |
| 7,349,263 B2 | 3/2008 | Kim et al. | |
| 7,372,754 B2 | 5/2008 | Hwang et al. | |
| 7,545,680 B2 * | 6/2009 | Kim et al. | ................ 365/185.23 |
| 7,599,219 B2 | 10/2009 | Kim et al. | |
| 7,911,850 B2 * | 3/2011 | Chae et al. | ................ 365/185.23 |
| 2002/0036921 A1 | 3/2002 | Tamada et al. | |
| 2006/0291290 A1 | 12/2006 | Kim et al. | |
| 2007/0025155 A1 | 2/2007 | Hwang et al. | |
| 2008/0137435 A1 | 6/2008 | Kim et al. | |

FOREIGN PATENT DOCUMENTS

| | | |
|---|---|---|
| JP | 2002-109892 A | 4/2002 |
| JP | 2007-012251 A | 1/2007 |
| JP | 2007-035249 A | 2/2007 |
| KR | 10-2007-0000525 B1 | 1/2007 |
| KR | 10-2007-0013601 B1 | 1/2007 |

\* cited by examiner

*Primary Examiner* — Tan T. Nguyen
(74) *Attorney, Agent, or Firm* — Harness, Dickey & Pierce, P.L.C.

(57) ABSTRACT

Memory devices and program methods thereof, the memory devices including a memory cell array with a three-dimensional structure, a voltage generator configured to supply a pass voltage and a program voltage to the memory cell array, and a control logic configured to make the rising slope of the pass voltage variable with a program loop during a program operation. The memory device may improve a program speed by adjusting the rising slope of the pass voltage according to the program loop.

20 Claims, 19 Drawing Sheets

MEMORY DEVICES AND PROGRAM METHODS THEREOF

CROSS-REFERENCE TO RELATED APPLICATIONS

This application claims priority under 35 USC §119 to Korean Patent Application No. 10-2011-0048638, filed on May 23, 2011, in the Korean Intellectual Property Office (KIPO), the entire contents of which is incorporated herein by reference.

BACKGROUND

1. Field

Example embodiments of the inventive concepts generally relate to semiconductor memory devices and, more particularly, to memory devices with three-dimensional structure and program methods thereof.

2. Description of the Related Art

Semiconductor memory devices may be classified into volatile memory devices such as DRAM and SRAM and non-volatile memory devices such as EEPROM, FRAM, PRAM, MRAM, and flash memory. Volatile memory devices lose their stored data when their power supplies are interrupted, while nonvolatile memory devices retain their stored data even when their power supplies are interrupted. In particular, flash memory devices have advantages such as high program speed, low power consumption, and large data storage capacity. Therefore, a flash memory system including a flash memory is widely used as a data storage medium.

Flash memory devices are increasing in integration density to meet users' demands for better performance and lower costs. However, conventional two-dimensional flash memory devices are limited with respect to increasing integration density due to their fabrication processes. Three-dimensional flash memory devices have been proposed to overcome the limitation. A three-dimensional flash memory device is fabricated by vertically and horizontally stacking various layers and forming a channel hole. However, it is considerably difficult to form a uniform channel hole of a three-dimensional flash memory device. If a cross section of a channel hole of a three-dimensional flash memory device is not uniform, rising slope of a wordline voltage may vary between different wordlines.

SUMMARY

Example embodiments of the inventive concepts provide memory devices.

In some example embodiments, a memory device may include a memory cell array with a three-dimensional structure, a voltage generator configured to supply a pass voltage and a program voltage to the memory cell array, and a control logic configured to make the rising slope of the pass voltage variable with a program loop during a program operation.

According to at least one example embodiment, the control logic may increase the rising slope of the pass voltage as the program loop increases. The control logic may include a voltage sloper configured to make the rising slope of the pass voltage variable. According to at least one other example embodiment, the voltage generator may include a voltage ramper configured to generate a pass voltage having a plurality of ramping levels. The voltage sloper may provide a ramp enable signal to the voltage ramper. The voltage ramper may provide a pass voltage having the same rising slope in the same program loop to a plurality of wordlines. The voltage ramper may adjust the rising slope of the pass voltage by adjusting a transition interval of the ramp enable signal.

Example embodiments of the inventive concepts provide a memory device program method including a memory cell array with a three-dimensional structure. In some example embodiments, the program method may include receiving a program command, making the rising slope of a pass voltage variable with a program loop, and applying the pass voltage of the variable rising slope to a wordline.

According to at least one example embodiment, a memory device includes a three-dimensional memory cell array, a voltage generator configured to supply a pass voltage and a program voltage to the memory cell array and a control logic configured to set a rising slope of the pass voltage based on a program loop of a program operation.

According to at least one example embodiment, a memory program method includes receiving a program command at a memory device including a three-dimensional memory cell array, setting a rising slope of a pass voltage based on a program loop of a program operation and applying the pass voltage to a wordline.

According to at least one example embodiment, a memory device includes a three-dimensional memory cell array including a plurality of memory cells connected to a plurality of wordlines, a voltage generator configured to apply a first pass voltage to the plurality of wordlines in a first program loop of a program operation and a second pass voltage to the plurality of wordlines in a second program loop of the program operation and a control logic configured to set rates of change of the first and second pass voltages.

BRIEF DESCRIPTION OF THE DRAWINGS

Example embodiments will be more clearly understood from the following brief description taken in conjunction with the accompanying drawings.

FIG. 1 is a block diagram illustrating flash memory systems according to example embodiments of the inventive concepts;

FIG. 2 is a block diagram illustrating a flash memory device of FIG. 1;

FIG. 3 is perspective view illustrating a three-dimensional structure of a memory block BLK1 of FIG. 2;

FIG. 4 is an equivalent circuit diagram of a memory block BLK1 of FIG. 3;

FIG. 5 is a top plan view illustrating cross-sections A and B of a memory block BLK1 of FIG. 3;

FIG. 6 is a graph illustrating a rising slope of wordline voltage as a function of wordline height;

FIG. 7 is a circuit diagram illustrating a voltage ramper of FIG. 2 according to at least one example embodiment;

FIG. 8 is a timing diagram illustrating operations of a voltage ramper of FIG. 7;

FIGS. 9 and 10 are timing diagrams illustrating flash memory device program methods according to example embodiments of the inventive concepts;

FIG. 11 is a flowchart illustrating program operations of flash memory devices according to example embodiments of the inventive concepts;

FIG. 12 is a cross-sectional view illustrating flash memory devices including two pillars on a substrate;

FIGS. 13-15 are block diagrams illustrating examples of various flash memory device applications according to example embodiments of the inventive concepts;

FIG. 16 is a block diagram illustrating memory cards according to example embodiments of the inventive concepts;

FIG. 17 is a block diagram illustrating solid-state drive (SSD) systems according to example embodiments of the inventive concepts;

FIG. 18 is a block diagram illustrating an SSD controller of FIG. 17; and

FIG. 19 is a block diagram illustrating electronic devices according to example embodiments of the inventive concepts.

Figure 1:
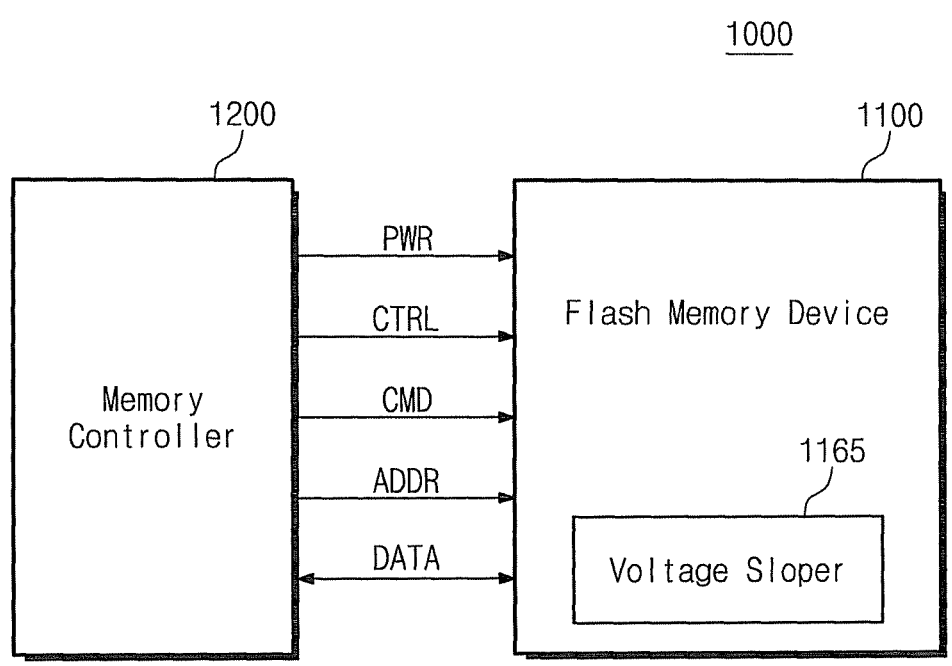
FIGS. 1-19 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram illustrating flash memory systems according to example embodiments of the inventive concepts. Referring to FIG. 1, a flash memory system 1000 may include a flash memory device 1100 and a memory controller 1200. The flash memory system 1000 may include all data storage media, for example, data storage media based on a flash memory (e.g., a memory card, a USB memory, an SSD and/or the like). The flash memory device 1100 may perform an erase, write and/or read operation in compliance with the control of the memory controller 1200. The flash memory device 1100 may receive a command CMD, an address ADDR and data DATA through an input/output line. The flash memory device 1100 may receive power PWR through a power line and may receive a control signal CTRL through a control line. The control signal CTRL may include a command latch enable signal (not illustrated), an address latch enable signal (not illustrated), a chip enable signal (not illustrated), a write enable signal (not illustrated), a read enable signal (not illustrated), and so forth.

The flash memory device 1100 may include a voltage sloper 1165. The voltage sloper 1165 may adjust the slope of a program voltage (Vpgm) and/or a pass voltage (Vpass) and/or the like of the flash memory device 1100. The voltage sloper 1165 may separately include a Vpgm sloper configured to adjust the slope of the program voltage Vpgm and a Vpass sloper configured to adjust the slope of the pass voltage Vpass. The voltage sloper 1165 may be implemented in the form of hardware or software. The voltage sloper 1165 may be incorporated in the memory controller 1200. In this case, the voltage sloper 1165 may be managed by a flash translation layer (FTL). A program speed of the flash memory system 1000 may be improved using the voltage sloper 1165.

Figure 2:
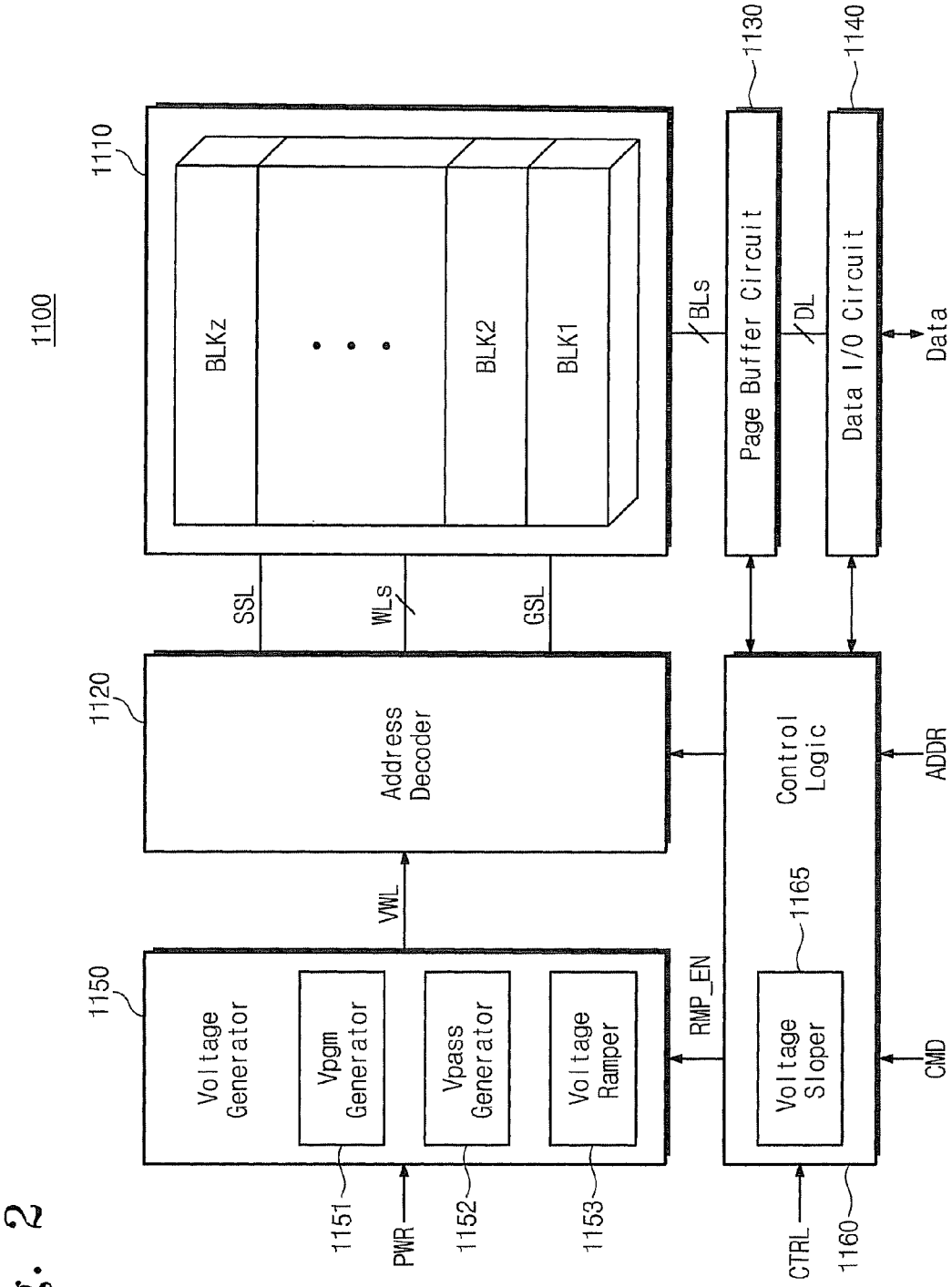

FIG. 2 is a block diagram illustrating a flash memory device of FIG. 1. A flash memory device 1100 may include a memory cell array 1110, an address decoder 1120, a page buffer circuit 1130, a data input/output circuit (data I/O circuit) 1140, a voltage generator 1150 and a control logic 1160. The control logic 1160 may include a voltage sloper 1165. The voltage sloper 1165 may adjust the slope of, for example, a program voltage Vpgm and/or a pass voltage Vpass. The memory cell array 1110 may include a plurality of memory blocks BLK1-BLKz each with a three-dimensional structure (e.g., a vertical and horizontal structure). In contrast, a memory block with a two-dimensional structure (e.g., a horizontal structure) may include memory cells only arranged in a horizontal direction with respect to a substrate. Each of the memory blocks BLK1-BLKz may constitute an erase unit of the flash memory device 1100.

An address decoder 1200 may be connected to the memory cell array 1110 through selection lines SSL, GSL and/or wordlines WLs. The address decoder 1200 may receive a wordline voltage (VWL) from the voltage generator 1150 and may be controlled by the control logic 1160. The address decoder 1120 may select a wordline during a program and/or read operation. A program voltage and/or a read voltage may be supplied to the selected wordline. The page buffer circuit 1130 may be connected to the memory cell array 1110 through a bitline BLs. The page buffer circuit 1130 may include a plurality of page buffers (not shown). One bitline may be connected to one page buffer (all BL structure) or two or more bitlines may be connected to one page buffer (shield BL structure). The page buffer 1130 may randomly store data to be programmed to a selected page and/or data read from the selected page.

The data I/O circuit 1140 may be internally connected to the page buffer circuit 1130 through a data line DL and may be externally connected to a memory controller (e.g., a memory controller 1200 of FIG. 1) through an input/output line I/O. The data I/O circuit 1140 may receive program data Data from the memory controller 1200 during a program operation and may provide read data to the memory controller 1200 during a read operation. The voltage generator 1150 may receive power PWR from the memory controller 1200 and may generate a wordline voltage VWL for reading and/or writing data. The voltage generator 1150 may generate a high voltage above a power supply voltage (Vcc). The high voltage may be used as a program voltage (Vpgm) and/or a pass voltage (Vpass).

The voltage generator 1150 may include a Vpgm generator 1151 and a Vpass generator 1152. The Vpgm generator 1151 may generate a program voltage Vpgm supplied to a selected wordline during a program operation. The program voltage (Vpgm) may gradually increase as a program loop proceeds.

The Vpass generator may generate a pass voltage (Vpass) that may be supplied to selected and unselected wordlines during a program operation. The pass voltage (Vpass) may be maintained at a constant level even when the program loop proceeds. The voltage generator 1150 may include a voltage ramper 1153. The voltage ramper 1153 may receive the program voltage (Vpgm) and/or the pass voltage (Vpass) and may control the slope of the wordline voltage VWL in response to a ramp enable signal RMP_EN.

The control logic 1160 may control program, read, and erase operations of a flash memory device 1100 by using a command CMD, an address ADDR, and a control signal CTRL. For example, during the program operation, the control logic 1160 may control the address decoder 1120 to supply a program voltage Vpgm to a selected wordline and control the page buffer circuit 1130 and the data I/O circuit 1140 to supply program data to a selected page. The control logic 1160 may include a voltage sloper 1165. The voltage sloper 1165 may generate a ramp enable signal RMP_EN to adjust a slope of the program voltage (Vpgm) and/or the pass voltage (Vpass). For example, the voltage sloper 1165 may improve program speed by increasing the slope of the pass voltage Vpass as the program loop proceeds. The voltage sloper 1165 may be configured separately, outside of the control logic 1160.

Figure 3:
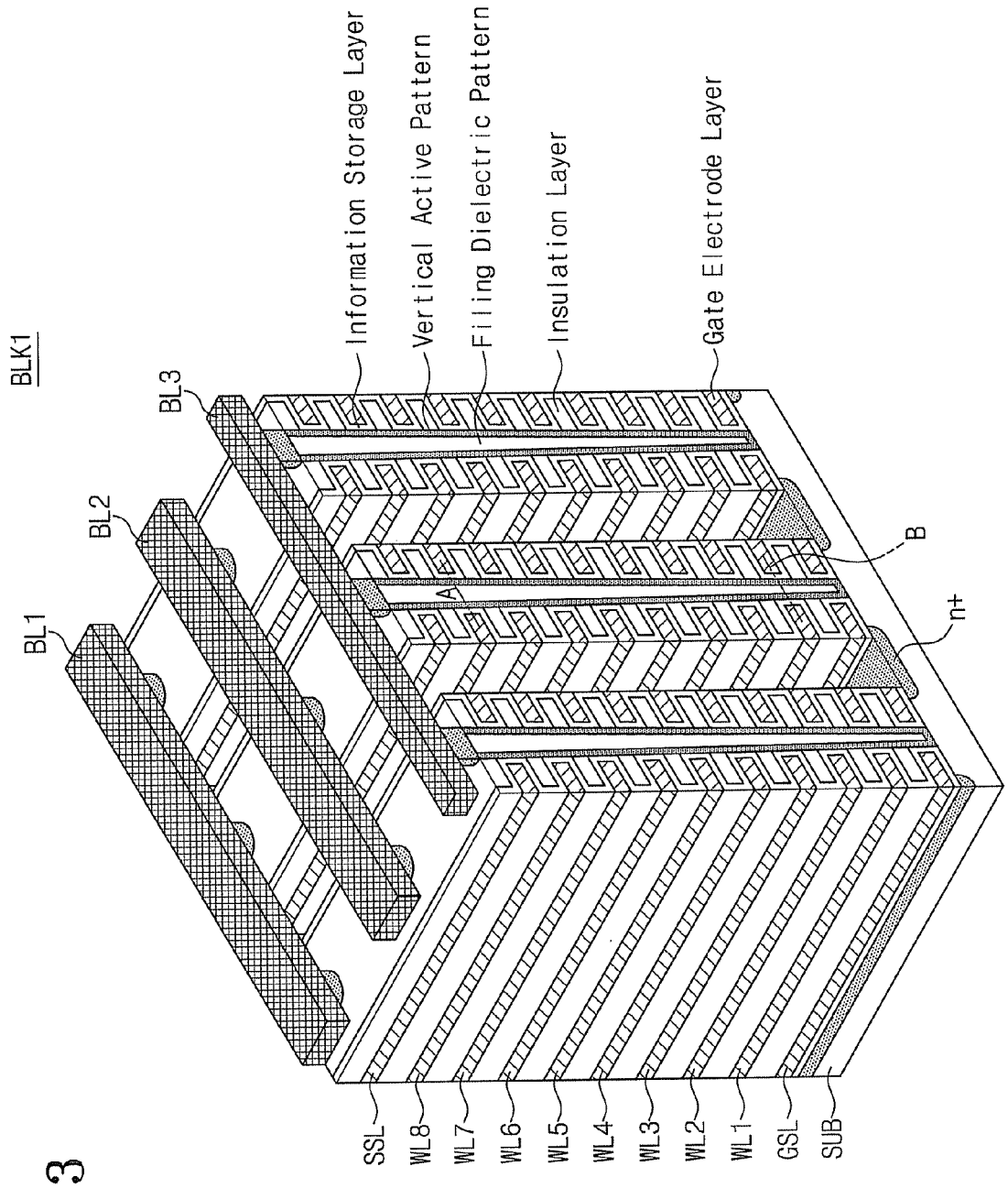

FIG. 3 is perspective view illustrating a three-dimensional structure of a memory block BLK1 of FIG. 2. Referring to FIG. 3, the memory block BLK1 may be perpendicular to a substrate SUB. An $n^+$-doped region may be in the substrate SUB. Gate electrode layers (e.g., WL1-WL8, GSL and SSL), and insulation layers may alternate on the substrate SUB. An information storage layer may be between each gate electrode layer and an insulating layer. The information storage layer may include, for example, a tunnel insulating layer, a charge storage layer and a blocking insulating layer. If the gate electrode and the insulating layer are vertically patterned, a V-shaped pillar may be formed. The pillar may be connected to the substrate SUB through the gate electrode layer and the insulating layer. The interior of the pillar, as a filling dielectric pattern, may include a dielectric material, for example, a silicon oxide. The exterior of the pillar, as a vertical active pattern, may include a semiconductor.

The gate electrode layer of the memory block BLK1 may be connected to a ground selection line GSL, a plurality of wordlines WL1-WL8 and a string selection line SSL. The pillar of the memory block BLK1 may be connected to a plurality of bitlines BL1-BL3. Although it is illustrated in FIG. 3 that one memory block BLK1 may include two selection lines GSL and SSL, eight wordlines WL1-WL8, and three bitlines BL1-BL3, a larger or smaller number of lines may be provided according to example embodiments.

Figure 4:
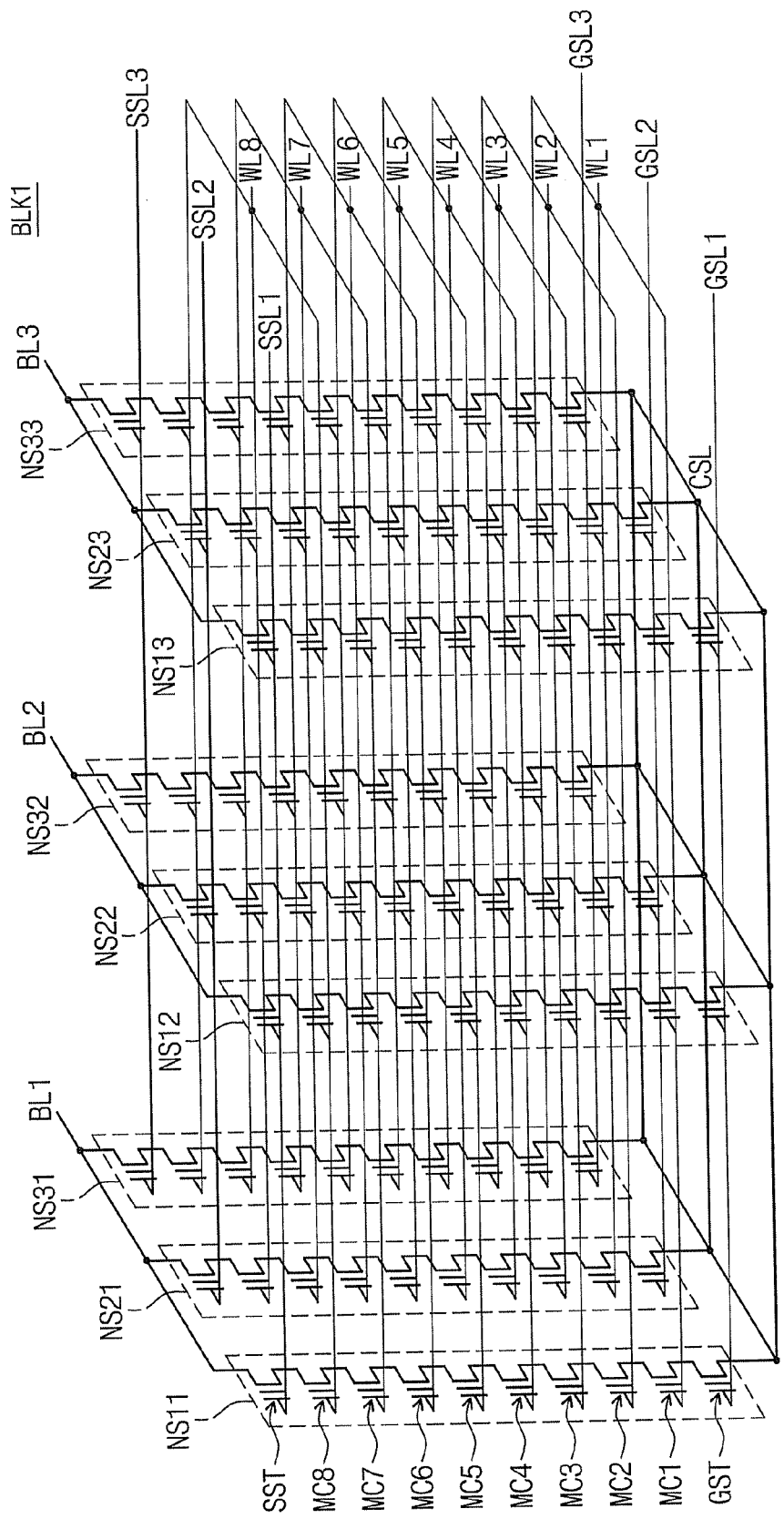

FIG. 4 is an equivalent circuit diagram of a memory block BLK1 of FIG. 3. Referring to FIG. 4, NAND strings NS11-NS33 may be coupled between bitlines BL1-BL3 and a common source line CSL. Each NAND string (e.g., NS11) may include a string selection transistor SST, a plurality of memory cells MC1-MC8, and a ground selection transistor GST. The string selection transistors SST may be connected to string selection lines SSL1-SSL3. The memory cells MC1-MC8 may be connected to corresponding wordlines WL1-WL8, respectively. The ground selection transistors GST may be connected to ground selection lines GSL1-GSL3. The string selection transistors SST may be connected to a bitlines BL and the ground selection transistors GST may be connected to a common source line CSL.

Wordlines (e.g., WL1) of the same height (e.g., same vertical plane) may be connected in common, and the ground selection lines GSL1-GSL3 and the string selection lines SSL1-SSL3 may be separated from each other. In case of memory cells connected to a first wordline WL1 and belonging to NAND strings NS11, NS12, and NS13 (hereinafter, the memory cells will be referred to as "page"), the first wordline WL1 and first selection lines SSL1 and GSL1 may be selected. Single-bit data or multi-bit data (at least two bits of data) may be stored in one memory cell. A memory cell capable of storing single-bit data may be called a single-level cell (SLC) or a single-bit cell, while a memory cell that may be capable of storing multi-bit data may be called a multi-level cell (MLC) or a multi-bit cell.

Figure 5:
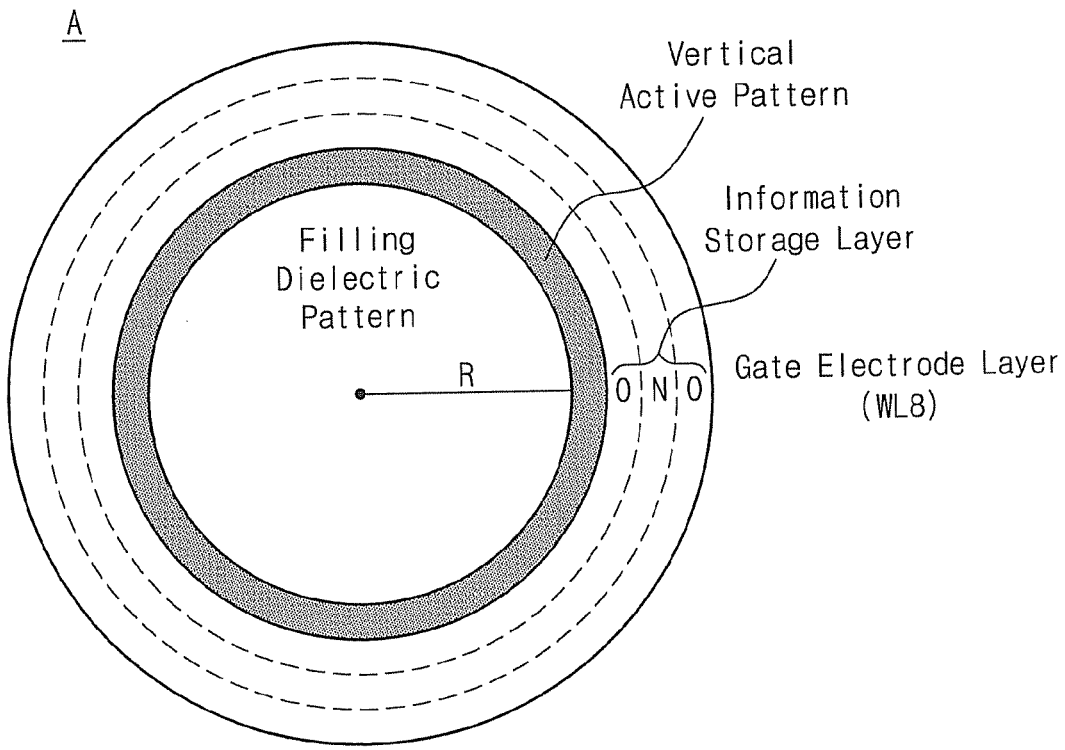
Figure 5:
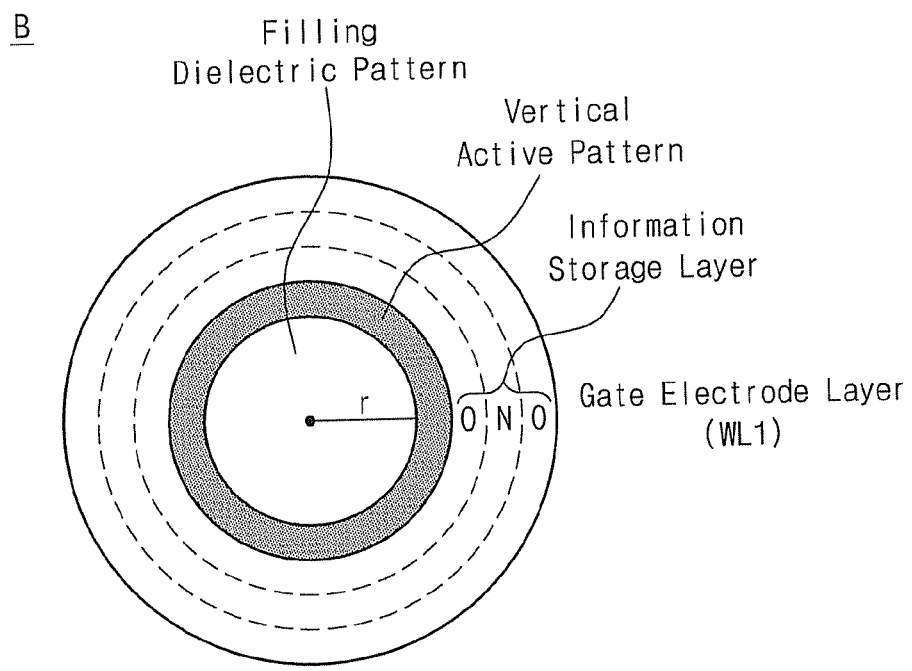

FIG. 5 is a top plan view illustrating cross-sections A and B of a memory block BLK1 of FIG. 3. The cross section A may be a cross section of a plane corresponding to an eighth wordline WL8, and the cross section B may be a cross section of a plane corresponding to the first wordline WL1. Referring to the cross sections A and B, a cell transistor may include a filling dielectric pattern, a vertical active pattern, an information storage layer and a gate electrode layer sequentially disposed from the interior of a pillar. The filling dielectric pattern may include a silicon oxide and/or an air gap. The vertical active pattern may be made of P-type silicon and may act as a channel of a cell transistor.

The information storage layer may include, for example, a tunnel oxide layer, a charge storage layer, and a blocking oxide layer. The tunnel oxide layer may act as a tunneling insulating layer through which charges migrate due to a tunneling effect. The charge storage layer may include a charge-trapping insulating layer. The charge storage layer may include, for example, a nitride (e.g., SiN) and/or a metal (e.g., aluminum and/or hafnium). The blocking oxide layer may act as an insulating layer between the gate electrode layer and the charge storage layer. The blocking oxide layer may include, for example, a silicon oxide. The tunnel oxide layer, the charge storage layer, and the blocking oxide layer may be, for example, an oxide-nitride-oxide (ONO) structure.

A memory block (e.g., as illustrated in FIG. 3) with a three-dimensional structure may be formed by etching a plurality of thin films at one time to form a hole and forming a silicon channel layer in the hole. A diameter of the hole that may be a result of an etch process may vary with depth. The diameter of the hole may increase as a function of distance from the substrate SUB. A radius R of a filling dielectric pattern corresponding to the eighth wordline WL8 may be greater than a radius r of a filling dielectric pattern corresponding to the first wordline WL1. The varying width of the hole may result in a difference between characteristics of a cell transistor connected to the eighth wordline WL8 and a cell transistor that may be connected to the first wordline WL1 (e.g., transistor characteristics may vary as a function of distance from the substrate). Generally, as a diameter of a pillar increases, an effective area of a gate electrode layer may be reduced and resistance of the gate electrode may increase. Coupling capacitance and resistance of a cell transistor may increase as the diameter of the pillar increases. Resistance R and capacitance C of the eighth wordline WL8 on the uppermost layer of the pillar may be at a maximum and/or increased.

If resistance R and capacitance C of a wordline increase, the slope of a program voltage Vpgm and/or a pass voltage Vpass may also increase. In this case, the slope (e.g., change over time represented in a graph) of a wordline voltage may vary with the height of a wordline. During a program operation, a difference of program speed and a disturbance characteristic may vary with the wordline and may increase threshold voltage dispersion of a memory block.

Figure 6:
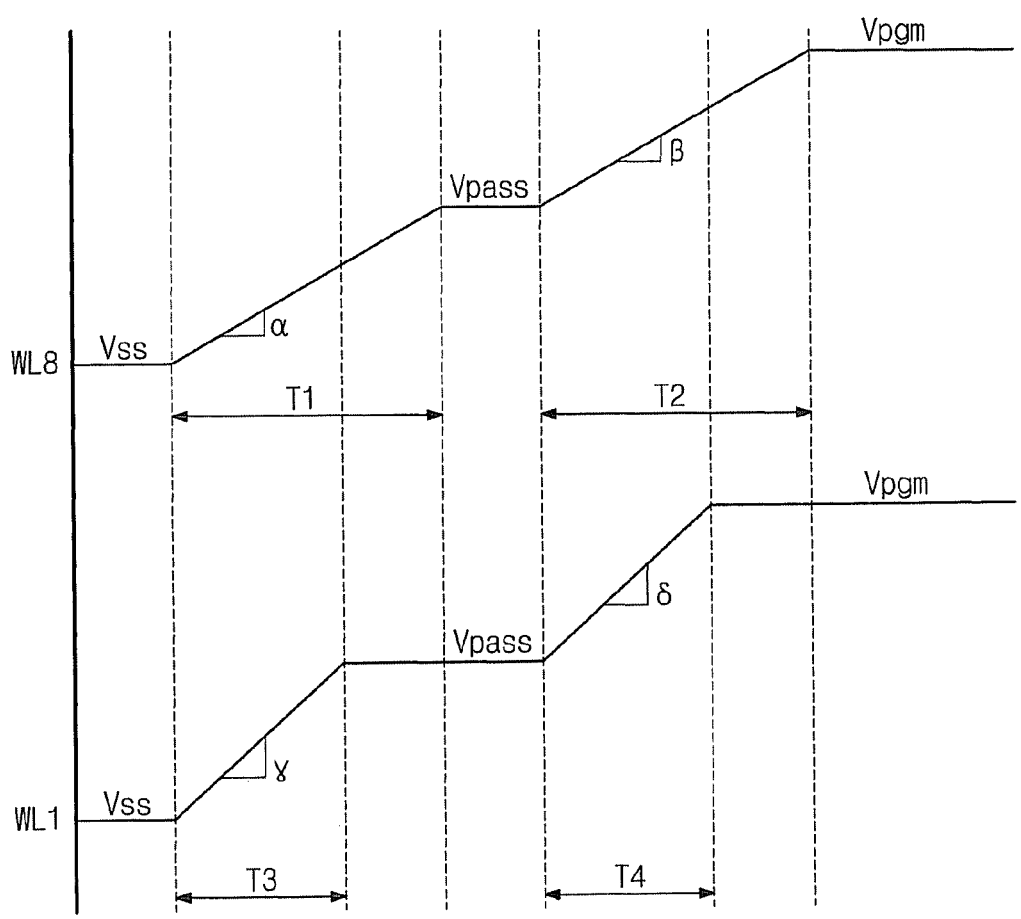

FIG. 6 is a graph illustrating a change in wordline voltage over time as a function of wordline height. Due to process characteristics and/or error, a sectional area of a pillar may increase as a function of distance from a substrate. An increase of sectional area of the pillar corresponds to a decrease in sectional area of a gate electrode layer. A sectional area of a wordline may decrease as a function of distance from the substrate. A sectional area of the first wordline WL1 may be larger than that of the eighth wordline WL8. Because resistance of a wordline is inversely proportional to its sectional area, resistance of the first wordline WL1 may be lower than resistance of the eighth wordline WL8.

A rate of change of a wordline voltage of a first wordline near the substrate may be greater than a rate of change of a wordline voltage of a second wordline farther away from the substrate than the first wordline. The rate of change is represented graphically by the slope of a line representing the wordline voltage (rate of change and slope of a word line voltage may be used interchangeably herein). This difference in rising slope may lead to read margin reduction resulting from a program speed difference. During a program operation, a voltage supplied to the first wordline WL1 may change at a rate represented by a rising slope 'γ' while rising up to the pass voltage Vpass in a time period T3. A voltage supplied to an eight wordline WL8 may change at a rate represented by a rising slope 'α' while rising up to the pass voltage Vpass in a time period T1. While the wordline voltages of wordlines WL1 and WL8 increase to the pass voltage Vpass, the rising slope of the first wordline voltage may be greater than that of the eighth wordline voltage. An instantaneous voltage at a point in time during the rise of the wordline voltages from Vss to Vpass may be different for different wordlines.

The first and eighth wordline voltages may change according to slopes 'δ' and 'β' while rising up to the program voltage Vpgm in time periods T4 and T2, respectively. While rising up to the program voltage Vpgm, the rising slope of the first wordline voltage may be greater than that of the eighth wordline voltage. When memory cells connected to the first and eighth wordlines WL1 and WL8 are programmed, memory cells connected to the first wordline WL1 may be programmed faster than those connected to the eighth wordline WL8. This program speed difference of the memory cells may lead to read margin reduction. A flash memory device 1100 according to example embodiments may allow a change in a program voltage and/or a pass voltage to be represented by the same slope in the same program loop during a program operation by using a voltage ramper 1153. The flash memory device 1100 may increase the slope of a pass voltage as a program loop proceeds by using the voltage ramper 1153 and the voltage sloper 1165 to improve a program speed.

Figure 7:
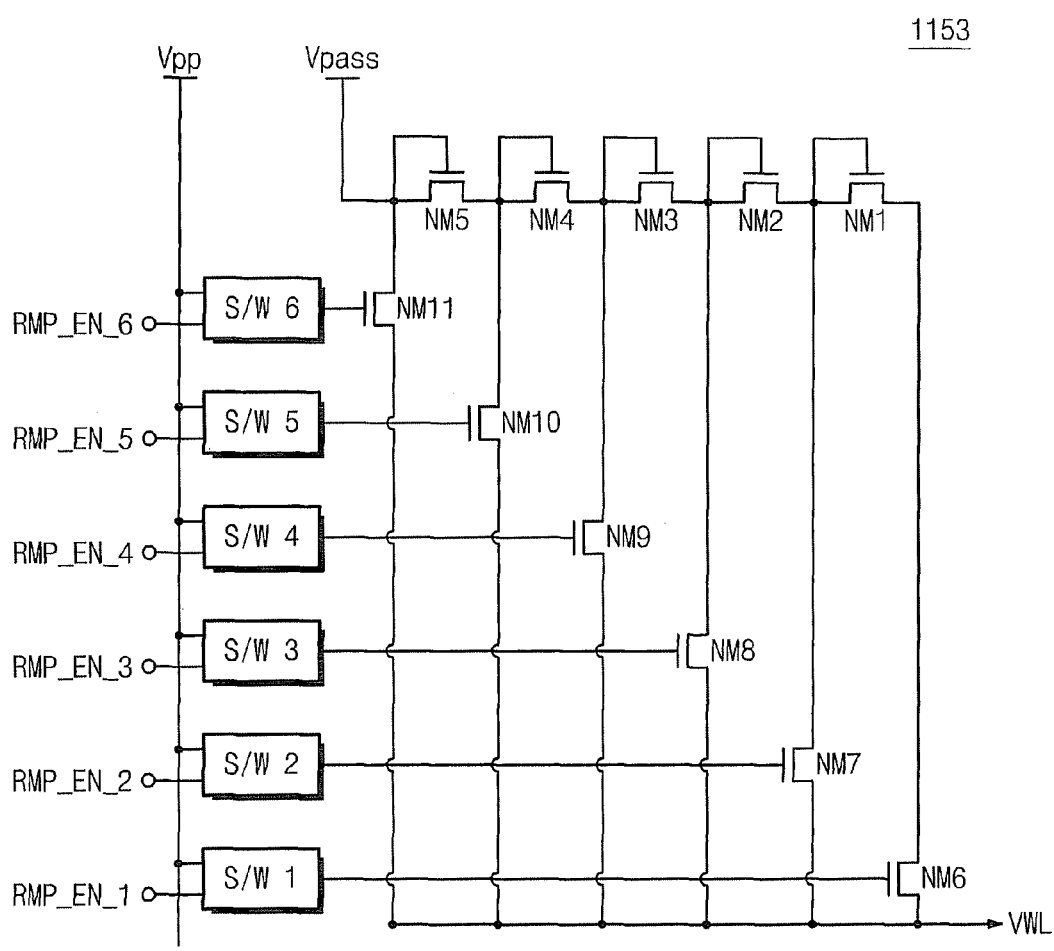

FIG. 7 is a circuit diagram illustrating a voltage ramper 1153 of FIG. 2 according to at least one example embodiment. In FIG. 7, it may be assumed that the pass voltage Vpass may be received from the Vpass generator 1152. Referring to FIG. 7, the voltage ramper 1153 may include first to sixth switches S/W1-S/W6 and first to eleventh transistors NM1-NM11. Each of the first to sixth switches S/W1-S/W6 may receive a high voltage Vpp. The high voltage Vpp, which may be higher than a power supply voltage Vcc, may be externally applied and/or internally generated. The first to sixth switches S/W1-S/W6 may receive first to sixth ramp enable signals RMP_EN_1-RMP_EN_6, respectively. In response to corresponding ramp enable signals, the first to sixth switches S/W1-S/W6 may transmit the high voltage Vpp to gates of the sixth to eleventh transistors NM6-NM11.

The first to fifth transistors NM1-NM5 may be serially connected. Gates and sources of the first to fourth transistors NM1-NM4 may be connected to drains of the second to fifth transistors NM2-NM5, respectively. A drain of the first transistor NM1 may be connected to a drain of the sixth transistor NM6, and a source of the fifth transistor NM5 may be connected to the pass voltage Vpass. Gates of the sixth to eleventh transistors NM6-NM11 may be connected to the switches S/W1-S/W6, respectively. Drains of the sixth to eleventh transistors NM6-NM11 may be connected to sources of the first to fifth transistors NM1-NM5, respectively. Sources of the sixth to eleventh transistors NM6-NM11 may be connected to the same node and may generate a wordline voltage VWL.

Figure 8:
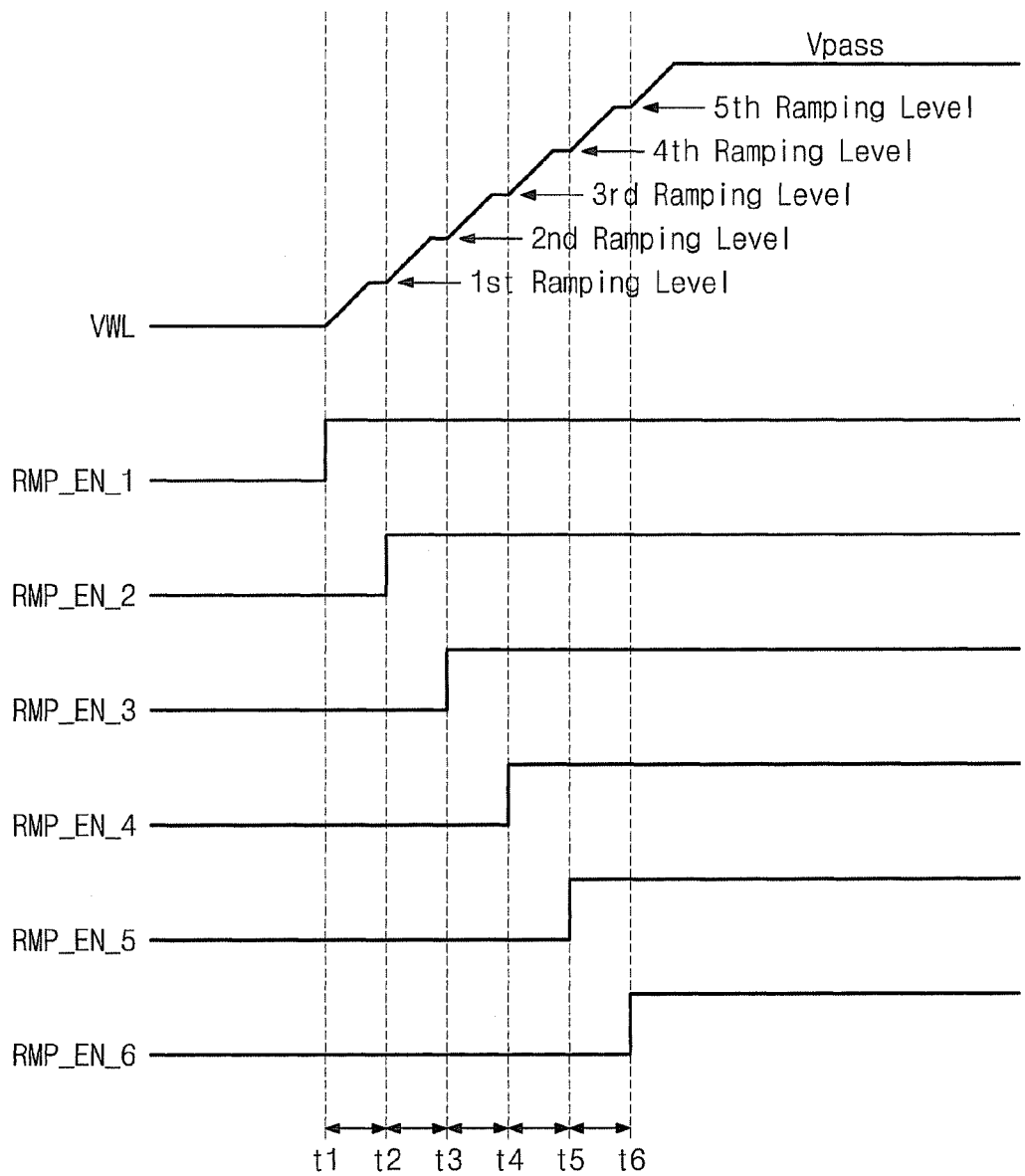

FIG. 8 is a timing diagram illustrating operations of a voltage ramper of FIG. 7. Referring to FIGS. 7 and 8, the first ramp enable signal RMP_EN_1 may be activated. The first switch S/W1 may transfer a high voltage Vpp to the gate of the sixth transistor NM6 in response to the activated first enable signal RMP_EN_1. The sixth transistor NM6 may be turned on. Because the drain of the sixth transistor NM6 is connected to the drain of the first transistor NM1, a voltage level dropping by threshold voltages of the first to fifth transistors NM1-NM5 may be output to the wordline voltage VWL from the pass voltage Vpass (e.g., Vpass minus the threshold voltages of NM1-NM5). The voltage level of the wordline voltage VWL may be called a first ramping level.

When the second ramp enable signal RMP_EN_1 is activated, the seventh transistor NM7 may be turned on and a voltage level dropping by threshold voltages of the second to fifth transistors NM2-NM5 may be output to the wordline voltage VWL from the pass voltage Vpass. The voltage level of the wordline voltage VWL may be called a second ramping level. The second ramping level may be higher than the first ramping level by the threshold voltage of the first transistor NM1. When the third to sixth ramp enable signals RMP_EN_3-RMP_EN_6 are sequentially activated, the wordline voltage VWL may gradually rise by threshold voltages of the second to fifth transistors NM2-NM5. As a result, the wordline voltage VWL may gradually rise up to the level of the pass voltage Vpass.

The flash memory device 1100 according to example embodiments may adjust the rising slope of the wordline voltage VWL in the same program loop. For example, the rising slope of the first wordline voltage may be adjusted to be the same as the rising slope of the eighth wordline voltage by adjusting transition intervals t1-t5 of respective ramp enable signals. As another example, the rising slope of the first wordline voltage may be adjusted to be the same as the rising slope of the eighth wordline voltage by varying the number of transistors of the voltage ramper 1153.

Figure 9:
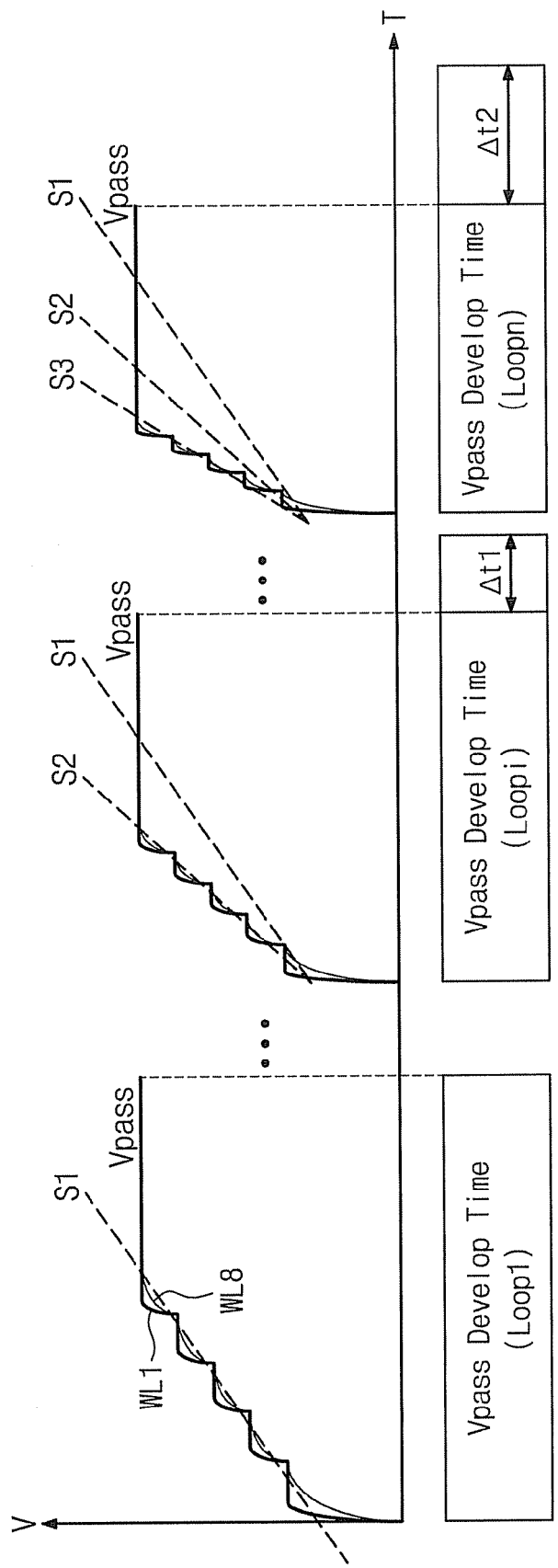
Figure 10:
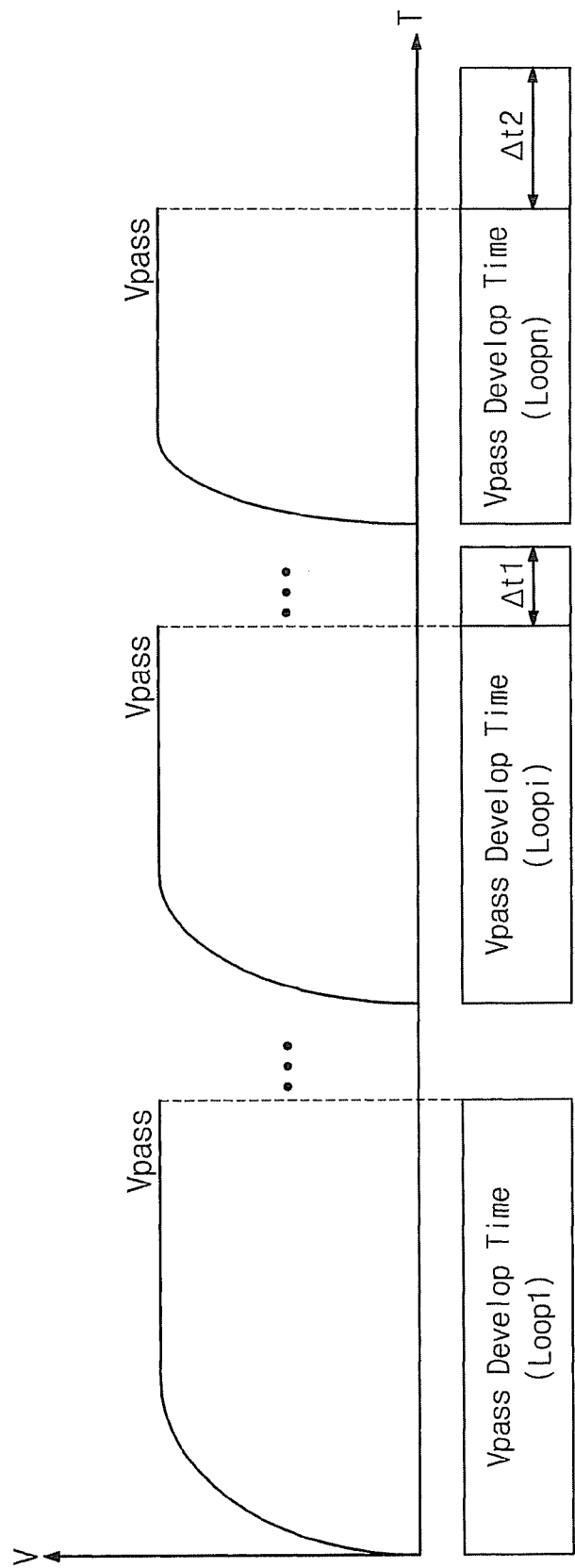

FIGS. 9 and 10 are timing diagrams illustrating flash memory device program methods according to example embodiments of the inventive concepts. A flash memory device (e.g., 1100 in FIG. 2) may apply a pass voltage to selected and unselected wordlines in respective program loops before applying a program voltage to the selected wordline. In the flash memory device 1100, a program voltage may gradually increase as a program loop proceeds while a pass voltage may be maintained at a constant level.

The flash memory device 1100 according to example embodiments of the inventive concepts may adjust the slope of a pass voltage as a program loop proceeds by using a voltage sloper 1165. As the program loop proceeds, a program operation may be terminated to increase the number of program-inhibited cells. If the number of program-inhibited cells increases, area capacitance between a control gate and a channel may be reduced during wordline loading.

In case of a three-dimensional flash memory, area capacitance may place a much greater deal of weight during wordline loading than a two-dimensional flash memory. Because slowest wordline loading may decrease, the slope of a wordline voltage may be adjusted at a higher speed than when a program operation is started. The flash memory device according to the inventive concept may decrease pass voltage develop time and may improve a program speed because the slope of a pass voltage increases as a program loop proceeds.

Referring to FIG. 9, it may be assumed that the rising slope of a pass voltage in a first program loop may be S1. The flash memory device 1100 may increase the rising slope of the pass voltage to S2 in an $i^{th}$ program loop and to S3 in an $n^{th}$ program loop. As shown in FIG. 9, when the rising slope of the pass voltage increases to S2 and S3, Vpass develop times may decrease by Δt1 and Δt2, respectively. The program speed may be improved by as much as the decrease of the Vpass develop time.

Referring to FIG. 2, the flash memory device 1100 according to example embodiments may allow the slope of a program voltage and/or a pass voltage to be the same slope in the same program loop during a program operation by using the voltage ramper 1153. The flash memory device 1100 may increase the slope of a pass voltage as a program loop may proceed by using the voltage ramper 1153 and the voltage sloper 1165 to improve a program speed. The flash memory device according to example embodiments may be applied even when the voltage ramper shown in FIG. 2 is not used. Referring to FIG. 10, as a program loop proceeds, the rising slope of a pass voltage may increase and Vpass develop times may decrease by Δt1 and Δt2, respectively. The program speed may be improved by as much as the decrease of the Vpass develop time.

Figure 11:
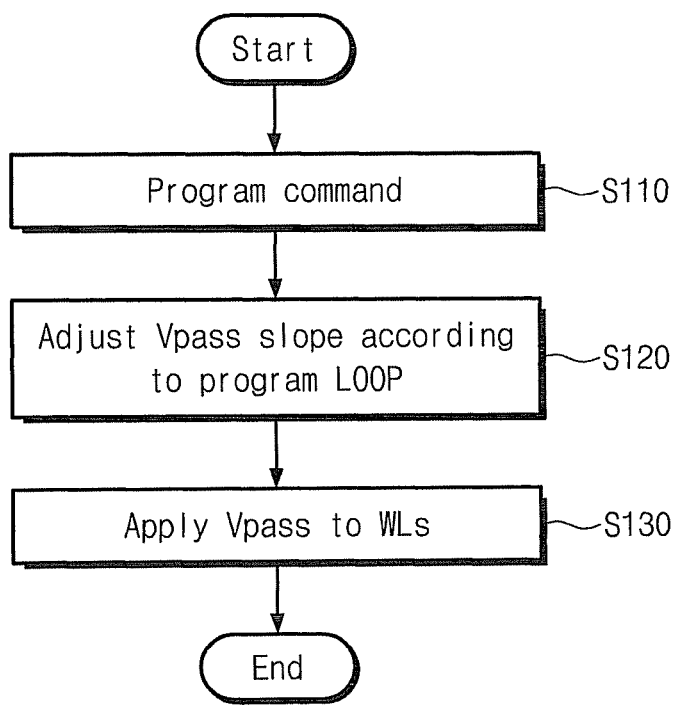

FIG. 11 is a flowchart illustrating program operations of flash memory devices according to example embodiments of the inventive concepts. At S110, a program command may be provided to the flash memory device. At S120, the flash memory device may adjust the slope of a pass voltage according to a program loop. At S130, the pass voltage may be applied to a wordline.

Figure 12:
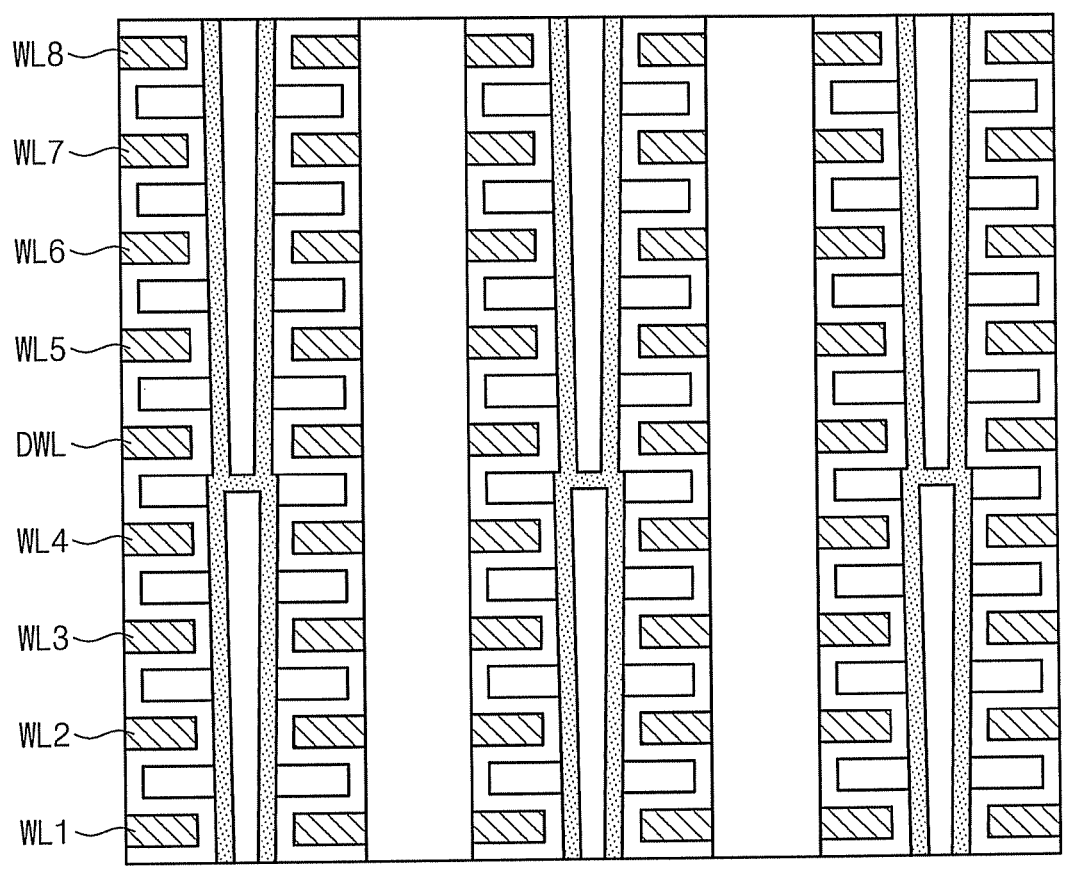

FIG. 12 is a cross-sectional view illustrating flash memory devices including two pillars on a substrate. Referring to FIG. 12, a flash memory device according to example embodiments and a program method of the flash memory device may be applied even when two or more pillars are formed on a substrate. There may be a dummy wordline DWL between the fourth and fifth wordlines WL4 and WL5. Example embodiments of the inventive concepts may be applied even when a two-dimensional (2D, horizontal-structure) flash memory is vertically formed.

A flash memory system according to example embodiments may be applied to various types of products. A flash memory system according to example embodiments may be incorporated into not only electronic devices (e.g., personal computers, digital cameras, camcorders, cell phones, MP3 players, portable multimedia players (PMPs), portable sound players (PSPs) and/or personal digital assistants (PDAs)) but also storage devices (e.g., memory cards, USB memories and/or sold-state drives (SSDs)).

Figure 13:
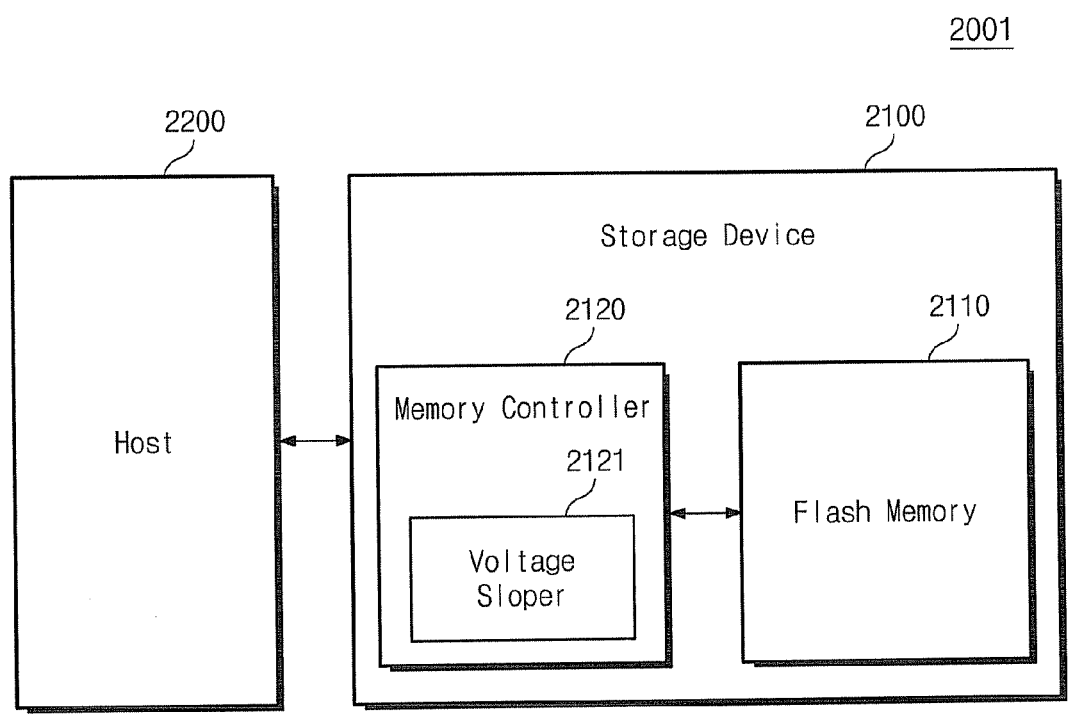
Figure 14:
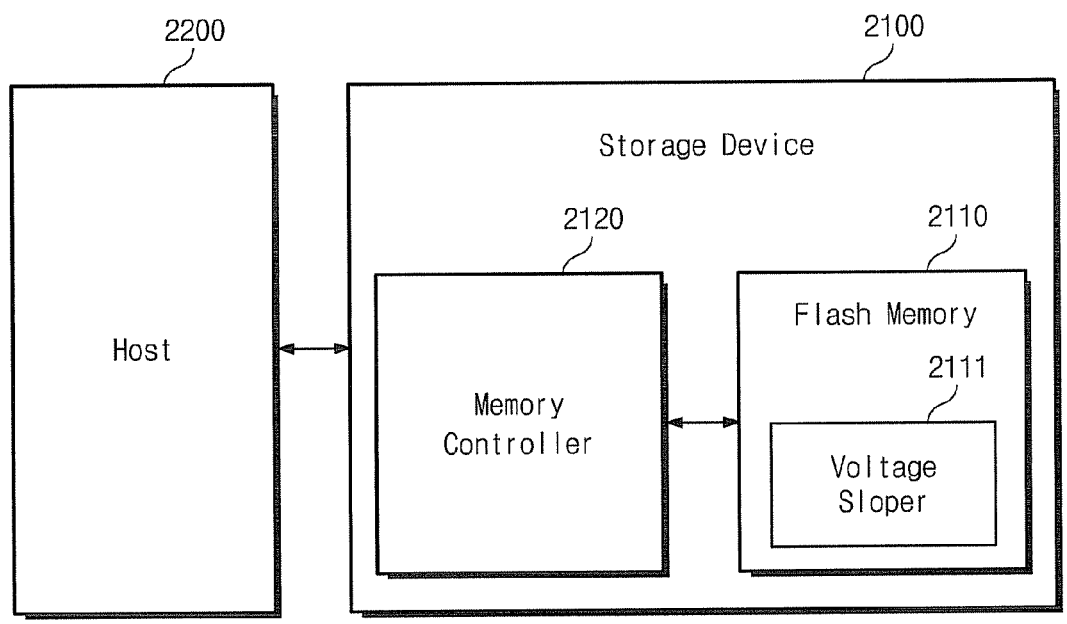
Figure 15:
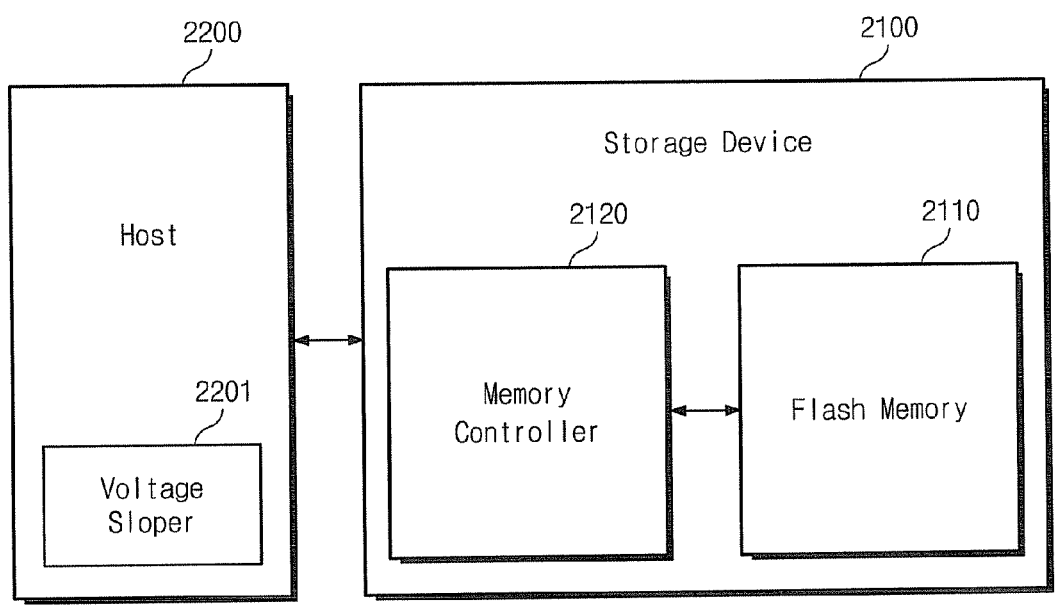

FIGS. 13-15 are block diagrams illustrating examples of various flash memory device applications according to example embodiments of the inventive concepts. Referring to FIGS. 13-15, flash memory systems 2001-2003 may each include a storage device 2100 and a host 2200. The storage device 2100 may include a flash memory 2110 and a memory controller 2120. The storage device 2100 may include a memory card (e.g., SD, MMC, and/or the like) or a removable portable storage device (e.g., USB memory, and/or the like).

The storage device 2100 may exchange data with a host through a host interface. The storage device 2100 may perform internal operations by receiving power from the host 2200. Referring to FIG. 13, a voltage sloper 2121 may be included in the memory controller 2120. Referring to FIG. 14, a voltage sloper 2111 may be included in a flash memory 2110. Referring to FIG. 15, a voltage sloper 2201 may be included in a host 2200. The flash memory systems 2001-2003 according to example embodiments may improve a program speed by using a voltage sloper.

Figure 16:
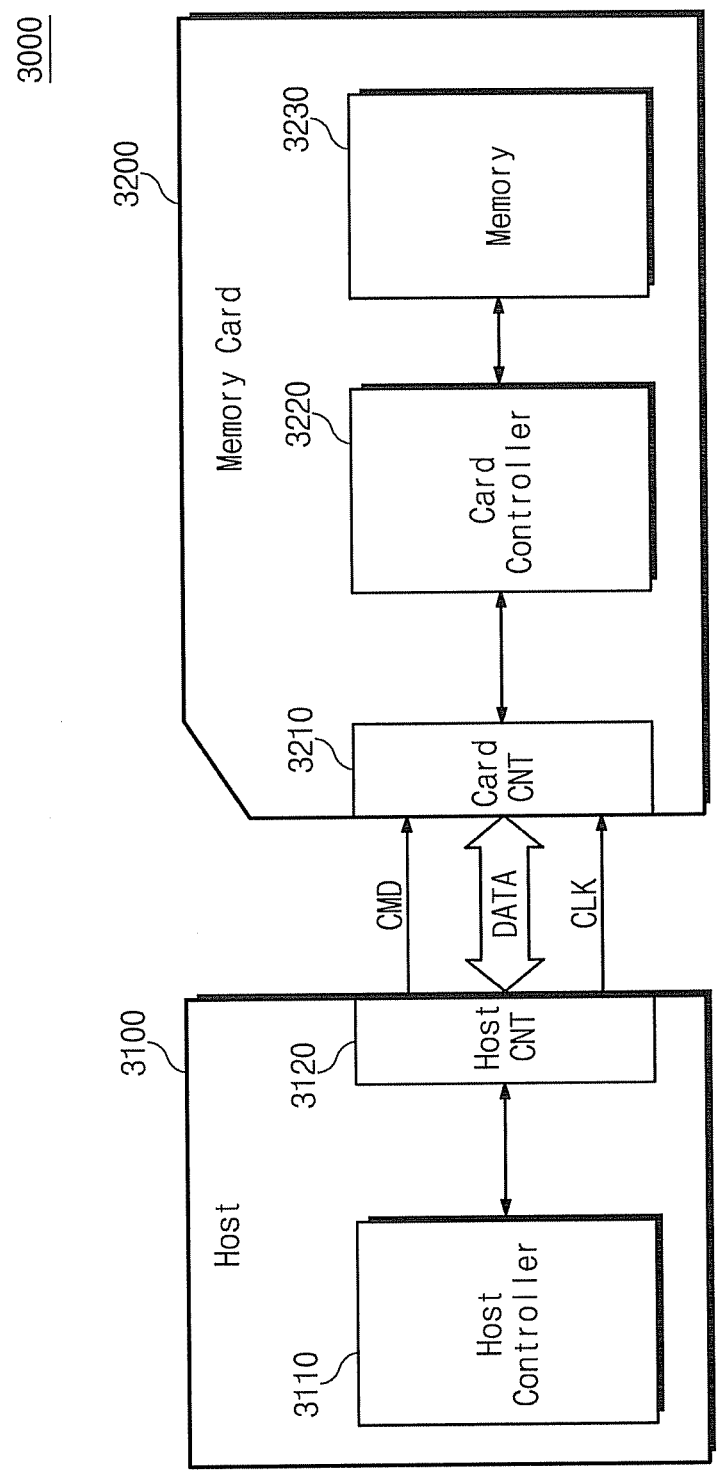

FIG. 16 is a block diagram illustrating memory cards according to example embodiments of the inventive concepts. A memory card system 3000 may include a host 3100 and a memory card 3200. The host 3100 may include a host controller 3110 and a host connection unit 3120. The memory card 3200 may include a card connection unit 3210, a card controller 3220 and a flash memory 3230. The host controller 3110, the card controller 3220 or the flash memory 3230 may include the above-described voltage sloper (not shown).

The host 3100 may write data into the memory card 3200 and/or may read data stored in the memory card 3200. The host controller 3110 may transfer a command (e.g., write command), a clock signal CLK that may be generated from a clock generator (not shown) in the host 3100 and data DATA to the memory card 3200 through the host connection unit 3120.

The card controller 3220 may store data in the flash memory 3230 in synchronization with a clock signal that may be generated from a clock generator (not shown) in the card controller 3220 in response to the write command that may be received through the card connection unit 3210. The flash memory 3230 may store the data transferred from the host 3100. For example, in the case that the host 3100 may be a digital camera, the flash memory 3230 may store image data. The memory card 3200 shown in FIG. 16 may improve a program speed of the flash memory 3230 by using a voltage sloper according to example embodiments (not shown).

Figure 17:
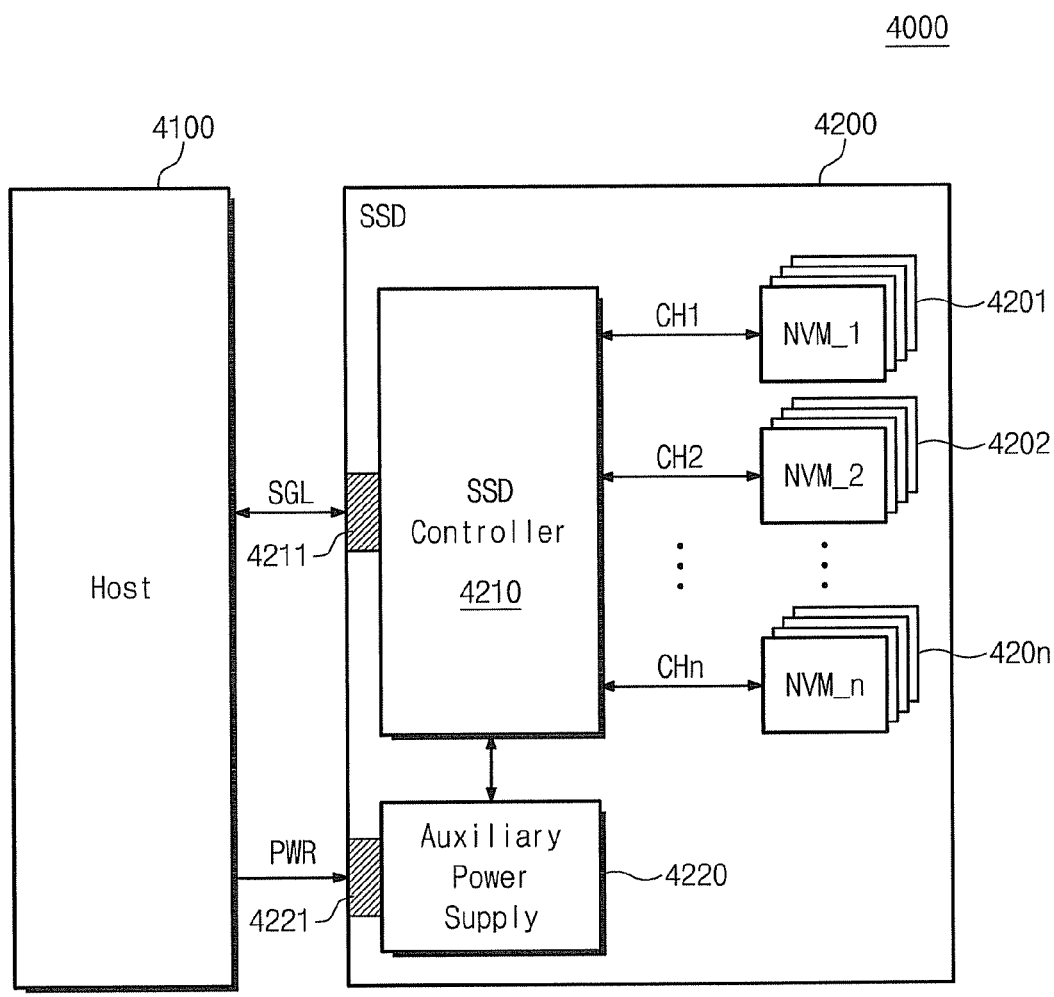

FIG. 17 is a block diagram illustrating solid-state drive (SSD) systems according to example embodiments of the inventive concepts. Referring to FIG. 17, an SSD system 4000 includes a host 4100 and an SSD 4200. The SSD 4200 may transfer/receive a signal SGL to/from the host 4100 through a signal connector 4211 and may receive power through a power connector 4221. The SSD 4200 may include at least a plurality of flash memories 4201-420n, an SSD controller 4210 and an auxiliary power supply 4220. The flash memories 4201-420n and/or the SSD controller 4210 may include a voltage sloper according to example embodiments (not shown).

The flash memories 4201-420n may be used a storage medium of the SSD 4200. The SSD 4200 may use flash memory, but a nonvolatile memory device such as PRAM, MRAM, ReRAM and/or FRAM may be used as the SSD 4200. The flash memories 4201-420n may be connected to the SSD controller 4210 through a plurality of channels CH1-CHn. One or more flash memories may be connected to one channel. Flash memory that may be connected to one channel may be connected to the same data bus. The SSD controller 4210 may transfer/receive a signal SGL to/from the host 4100 through the signal connector 4211. The signal SGL may include, for example, a command, an address and data. The SSD controller 4210 may write data into a flash memory and/or may read data from the flash memory. The auxiliary power supply 4220 may be connected to the host 4100 through the power connector 4221. The auxiliary power supply 4220 may be charged by receiving power PWR from the host 4100. The auxiliary power supply 4220 may be inside the SSD 4200 and/or outside the SSD 4200. For example, the auxiliary power supply 4220 may be at a main board and supply an auxiliary power to the SSD 4200.

Figure 18:
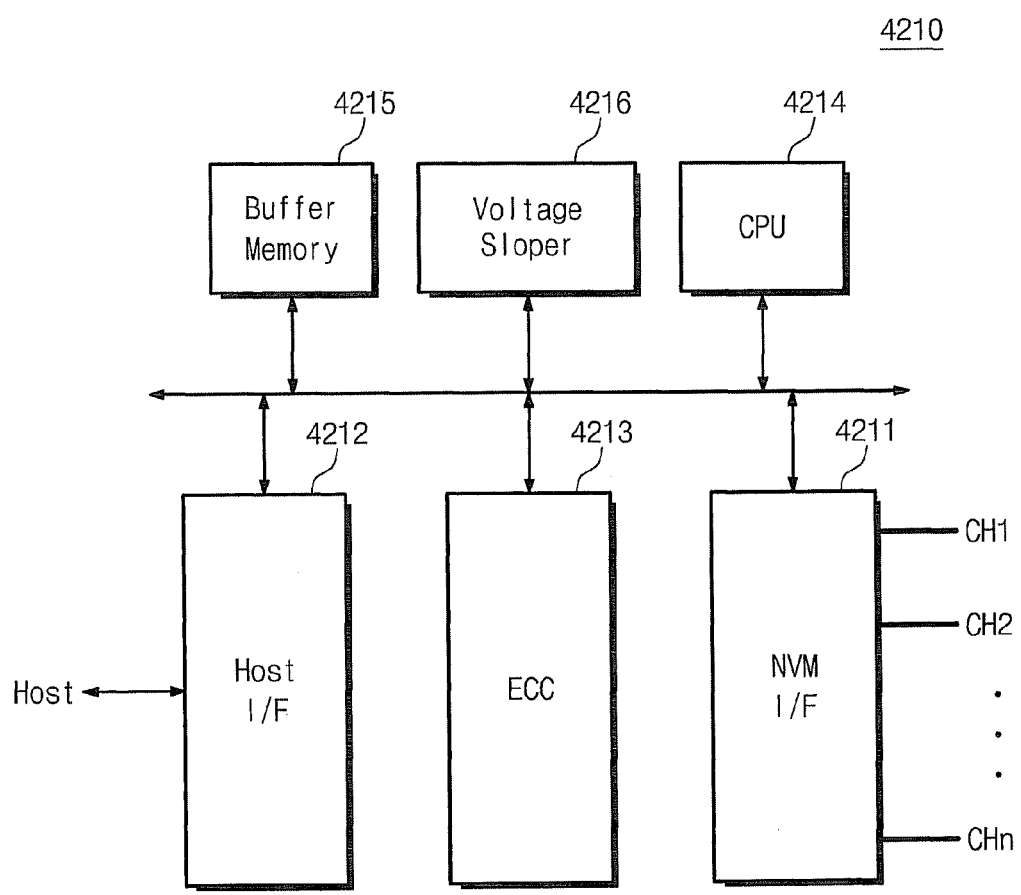

FIG. 18 is a block diagram illustrating an SSD controller of FIG. 17. Referring to FIG. 18, an SSD controller 4210 may include a nonvolatile memory interface (NVM interface) 4211, a host interface 4212, an error correction code (ECC) circuit 4213, a central processing unit (CPU) 4214, a buffer memory 4215 and a voltage sloper 4216. The NVM interface 4211 may scatter data transferred from the buffer memory 4215 to channels CH1-CHn. The NVM interface 4211 may transfer data read from flash memories 4201-420n to the buffer memory 4215. The NVM interface 4211 may use an interface manner of a flash memory. The SSD controller 4210 may perform a program, read and/or erase operation according to the interface manner of a flash memory.

The host interface 4212 may provide an interface with the SSD 4100 according to the protocol of the host 4212. The host interface 4212 may communicate with the host 4100 through Universal Serial Bus (USB), Small Component Small Interface (SCSI), Peripheral Component Interconnection (PCI) express, Advanced Technology Attachment (ATA), Parallel-ATA (PATA), Serial-ATA (SATA) and/or Serial Attached SCSI (SAS). The host interface 4212 may perform a disk emulation function in order for the host 4100 to recognize the SSD 4200 as a hard disk drive (HDD).

The ECC circuit 4213 may generate an error correction code (ECC) using the data transferred to the flash memories 4201-420n. The generated ECC may be stored in a spare area of the flash memories 4201-420n. The ECC circuit 4213 may detect an error of data read from the flash memories 4201-420n. If the detected error is within capacitance, the ECC circuit 4213 may correct the detected error. The CPU 4214 may analyze and process a signal SGL input from a host (4100 in FIG. 17). The CPU 4213 may control the host 4100 and/or the flash memories 4201-420n through the host interface 4212 and/or the NVM interface 4211. The CPU 4214 may control the operation of the flash memories 4201-420n according to firmware for driving the SSD 4200.

The buffer memory 4215 may temporarily store write data provided from the host 4100 and/or data that may be read from the flash memory. The buffer memory 4215 may store meta data and/or cache data to be stored in the flash memories 4201-420n. During a sudden power-off operation, the meta data or the cache data stored in the buffer memory 4215 may be stored in the flash memories 4201-420n. DRAM and/or SRAM may be included in the buffer memory 4215. The solid-state drive (SSD) 4000 shown in FIGS. 17 and 18 may improve a program speed by using a voltage sloper 4216 according to example embodiments.

Figure 19:
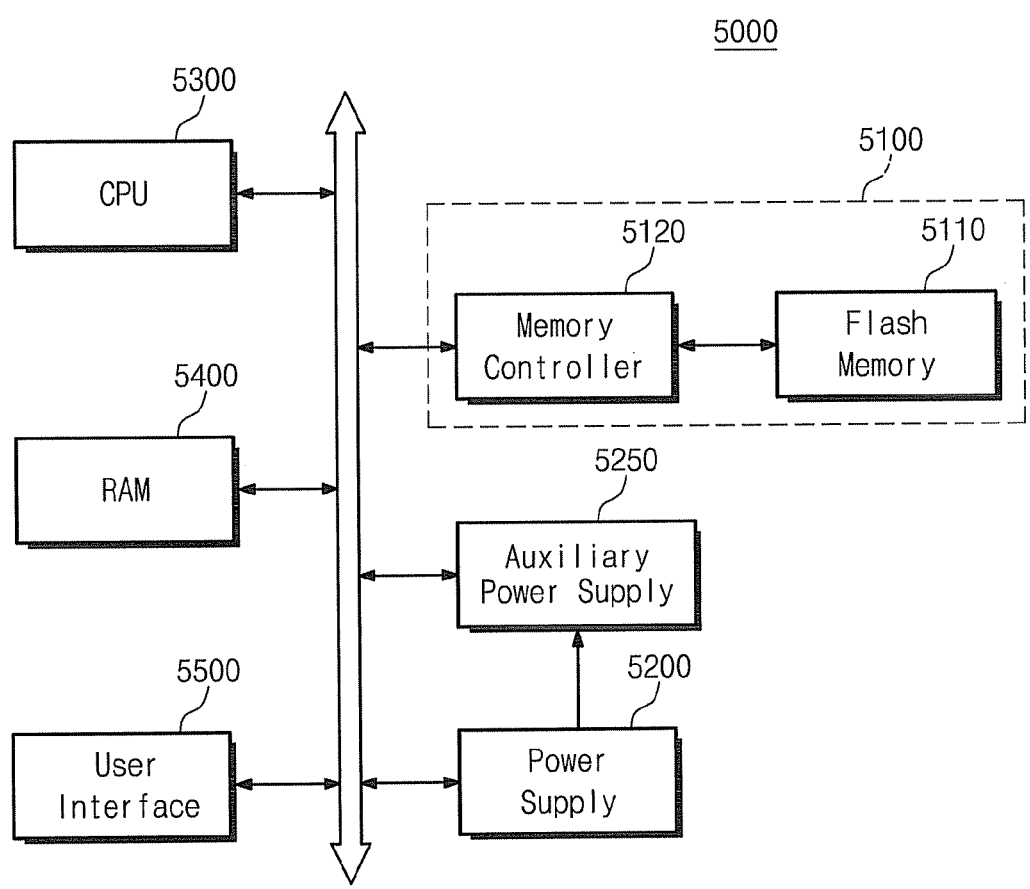

FIG. 19 is a block diagram illustrating electronic devices according to example embodiments of the inventive concepts. FIG. 19 is a block diagram illustrating examples in which a flash memory system according to example embodiments is implemented with an electronic device 5000. The electronic device 5000 may be implemented into a portable electronic device, for example, a notebook computer, a cell phone, a personal digital assistant (PDA) and/or a camera. Referring to FIG. 19, the electronic device 5000 may include a memory system 5100, a power supply 5200, a central processing unit (CPU) 5300, a random access memory (RAM) 5400 and a user interface 5500. The memory system 5100 may include a flash memory 5110 and a memory controller 5120. The memory system 5100 may improve a program speed by using a voltage sloper according to example embodiments (not shown).

According to example embodiments, the rising slope of a pass voltage may be adjusted according to a program loop to improve a program speed. While example embodiments have been particularly shown and described, it will be understood by one of ordinary skill in the art that variations in form and detail may be made therein without departing from the spirit and scope of the claims.

What is claimed is:

1. A memory device, comprising:
   a three-dimensional memory cell array;
   a voltage generator configured to supply a pass voltage and a program voltage to the memory cell array; and
   a control logic configured to set a rising slope of the pass voltage based on a program loop of a program operation.

2. The memory device set forth in claim 1, wherein the control logic is configured to increase the rising slope of the pass voltage as the program loop increases.

3. The memory device set forth in claim 1, wherein the control logic includes a voltage sloper configured to set the rising slope of the pass voltage.

4. The memory device set forth in claim 3, wherein the voltage generator includes a voltage ramper configured to generate the pass voltage using a plurality of ramping levels.

5. The memory device set forth in claim 4, wherein the voltage sloper is configured to supply at least one ramp enable signal to the voltage ramper.

6. The memory device set forth in claim 4, wherein the voltage ramper is configured to supply the pass voltage with a same rising slope in a same program loop to a plurality of wordlines.

7. The memory device set forth in claim 4, wherein the voltage ramper is configured to vary the rising slope of the pass voltage by adjusting a transition interval of a ramp enable signal.

8. The memory device set forth in claim 1, wherein the memory cell array includes an information storage layer, the information storage layer including a tunnel oxide layer, a charge storage layer, and a blocking oxide layer.

9. The memory device set forth in claim 8, wherein the charge storage layer is one of a nitride (SiN) and a metal oxide.

10. A memory card system, comprising:
    a host; and
    a memory card including the memory device of claim 1.

11. A memory program method, comprising:
    receiving a program command at a memory device including a three-dimensional memory cell array;
    setting a rising slope of a pass voltage based on a program loop of a program operation; and
    applying the pass voltage to a wordline.

12. The program method as set forth in claim 11, wherein the setting a rising slope includes increasing the rising slope of the pass voltage as the program loop increases.

13. The program method as set forth in claim 11, wherein the applying the pass voltage includes ramping the pass voltage using a plurality of ramping levels during a time period corresponding to the rising slope of the pass voltage.

14. The program method as set forth in claim 11, wherein the applying the pass voltage includes applying the pass voltage with a same rising slope in a same program loop to a plurality of wordlines.

15. The program method as set forth in claim 11, further comprising:
    generating a ramp enable signal to adjust the rising slope of the pass voltage.

16. The program method as set forth in claim 15, wherein the generating a ramp enable signal includes adjusting a transition interval of the ramp enable signal.

17. A memory device, comprising:
    a three-dimensional memory cell array including a plurality of memory cells connected to a plurality of wordlines;
    a voltage generator configured to apply a first pass voltage to the plurality of wordlines in a first program loop of a program operation and a second pass voltage to the plurality of wordlines in a second program loop of the program operation; and
    a control logic configured to set rates of change of the first and second pass voltages.

18. The memory device set forth in claim 17, wherein
    the control logic is configured to set a first rate of change of a first rising edge of the first pass voltage, and set a second rate of change of a second rising edge of the second pass voltage, the second rate of change greater than the first rate of change, and
    the second program loop is subsequent to the first program loop.

19. The memory device set forth in claim 18, wherein
    the voltage generator is configured to apply the first pass voltage to each of the plurality of wordlines,
    resistances of at least two of the plurality of wordlines are different, and
    the first rate of change is determined based on a greatest of the resistances.

20. A solid state drive system, comprising:
    a host; and
    a solid state drive including the memory device of claim 17.

* * * * *